(12) United States Patent
Shiikuma

(10) Patent No.: US 7,649,413 B2
(45) Date of Patent: Jan. 19, 2010

(54) HIGH-FREQUENCY POWER AMPLIFIER IMPROVED IN SIZE AND COST

(76) Inventor: Kazumi Shiikuma, c/o NEC Corporation, 7-1, Shiba 5-chome, Minato-ku, Tokyo 108-8001 (JP)

( * ) Notice: Subject to any disclaimer, the term of this patent is extended or adjusted under 35 U.S.C. 154(b) by 57 days.

(21) Appl. No.: 11/929,017

(22) Filed: Oct. 30, 2007

(65) Prior Publication Data

US 2008/0111631 A1    May 15, 2008

(30) Foreign Application Priority Data

Nov. 10, 2006   (JP) .............................. 2006-305396

(51) Int. Cl.
*H03G 3/20* (2006.01)
(52) U.S. Cl. ....................... 330/136; 330/129
(58) Field of Classification Search .............. 330/136, 330/129, 311, 296, 285
See application file for complete search history.

(56) References Cited

U.S. PATENT DOCUMENTS

| | | | | |
|---|---|---|---|---|
| 3,443,241 A | * | 5/1969 | Pitzalis, Jr | .................. 330/285 |
| 6,137,358 A | * | 10/2000 | Midya et al. | ................. 330/136 |
| 6,583,664 B2 | * | 6/2003 | Mathe et al. | ................... 330/10 |
| 6,642,794 B2 | * | 11/2003 | Mulder et al. | ................ 330/295 |
| 6,781,459 B1 | * | 8/2004 | Brown | ......................... 330/252 |
| 6,801,082 B2 | * | 10/2004 | Midya et al. | ................... 330/10 |
| 7,474,149 B2 | * | 1/2009 | Snelgrove et al. | ........... 330/136 |

FOREIGN PATENT DOCUMENTS

| | | |
|---|---|---|
| JP | 57193048 | 11/1982 |
| JP | 4216206 | 8/1992 |
| JP | 8275514 | 10/1996 |
| JP | 2000196387 | 7/2000 |
| JP | 2005502251 | 1/2005 |
| JP | 2005184273 | 7/2005 |
| JP | 2006521081 | 9/2006 |

OTHER PUBLICATIONS

Raab et al. "Power Amplifiers and Transmitters for RF and Microwave" IEEE Transactions on Microwave Theory and Techniques, vol. 50, No. 3, Mar. 2002, pp. 814-826.
Kimball et al. "50% PAE WCDMA Basestation Amplifier Implemented with GaN HFETs" Compound Semiconductor Integrated Circuit Symposium IEEE, 2005, pp. 89-92.

* cited by examiner

*Primary Examiner*—Henry K Choe

(57) ABSTRACT

A high-frequency power amplifier of the present invention comprises a power supply unit for including a transistor for switching whose drain electrode—source electrode or collector electrode—emitter electrode are on/off controlled according to a pulse signal corresponding to an envelope signal of a high-frequency signal applied to a gate electrode or to a base electrode, and for generating a voltage corresponding to the envelope signal by means of on/off operation of the transistor for switching; and a transistor for power amplification which is a source electrode grounded type or an emitter electrode grounded type, to which a voltage generated by the power supply unit is supplied as an operating voltage, in which the high-frequency signal is applied to the gate electrode or to the base electrode. Further, the transistor for switching in the power supply unit and the transistor for power amplification are arranged so that the source electrodes or the emitter electrodes are commonly connected in one package.

4 Claims, 6 Drawing Sheets

US 7,649,413 B2

HIGH-FREQUENCY POWER AMPLIFIER IMPROVED IN SIZE AND COST

This application is based upon and claims the benefit of priority from Japanese Patent Application No. 2006-305396 filed on Nov. 10, 2006, the content of which is incorporated by reference.

BACKGROUND OF THE INVENTION

1. Field of the Invention

The present invention relates to a high-frequency power amplifier requiring linearity and high efficiency used for multi-level digital modulation communication systems.

2. Description of the Related Art

Recent multi-level digital modulation communication systems etc. often deal with signals which are largely different from each other as concerns average of signal amplitude and the maximum amplitude. Therefore, a power amplifier used for radio communication systems requires linearity and high efficiency. However, when the power amplifier amplifies such signal, the amplifier has generally a lower efficiency, because the operating point of the amplifier is set to be able to amplify a signal to the maximum amplitude without distortion, and accordingly there is little time left to operate near the region having saturation power where a comparatively high efficiency can be maintained.

To solve such problems, various techniques for increasing the efficiency of an amplifier while maintaining linearity have been developed. One of the techniques includes envelope tracking (hereinafter, called "ET") or envelope elimination and restoration (hereinafter, called "EER"). A basic configuration of an amplifier using these techniques is disclosed in Japanese Patent Laid-Open No. 2005-184273, and National Publication of International Patent Application No. 2006-521081 etc.

Further, a basic configuration of the amplifier is disclosed in "Power Amplifiers and Transmitters for RF and Microwave", IEEE TRANSACTIONS ON MICROWAVE THEORY AND TECHNIQUES, VOL. 50, NO. 3, MARCH 2002, pp 814 to 826, and "50% PAE WCDMA Base-station Amplifier Implemented with GaN-HFETs", Compound Semiconductor Integrated Circuit Symposium IEEE, 30 Oct. to 2 Nov. 2005, pp 1 to 4 etc.

In the configurations of those amplifiers, a power supply unit for supplying an amplifying element is configured by, for example, a circuit which operates in switching operation, such as a class S amplifier, using a high-speed switching element to reduce loss. Higher efficiency than that of a normal amplifier such as a class A or B amplifier is realized by externally controlling this high-efficiency power supply unit to fulfill desired ET or EER operation and function, and further high efficiency has been accomplished, also when the power supply unit is outputting with back-off being taken from saturation power.

FIG. 1 is a schematic block diagram illustrating an example of a high-efficiency amplifier to which an EER technique is applied.

An Input signal (modulated signal) is applied to limiter 41 and envelope detector 42. Limiter 41 extracts a phase modulated component signal of the input signal, and envelope detector 42 extracts an envelope signal corresponding to an amplitude modulated component of the input signal. The extracted, phase modulated component signal having constant amplitude is applied to transistor 45 constituting a power amplifier and is amplified.

On the other hand, the extracted envelope signal is applied to a power supply voltage control unit. The power supply voltage control unit includes, as shown in FIG. 1, amplitude-pulse conversion unit 43 including a pulse width modulation (PWM) system etc. for changing a pulse width correspond to an amplitude, switching transistor 44, and a low-pass filter composed of capacitor 46 and choke coil 47. The extracted envelope signal is converted into a voltage corresponding to the envelope signal by the power supply voltage control unit and supplied as an operating power supply voltage for transistor 45 constituting the power amplifier. Amplified signal is outputted from an output terminal of an amplified signal.

As a result, the phase modulated component signal having constant amplitude, extracted in a manner described above, is amplified at high efficiency by transistor 45 constituting the power amplifier, and the power supply voltage for transistor 45 constituting this power amplifier changes according to the voltage supplied by the power supply voltage control unit. Therefore, the signal applied to this power amplifier is amplified so that its amplitude changes correspond to the power supply voltage, and the amplitude modulated component is also reproduced, and therefore a high power amplifier having high efficiency and low distortion is realized.

FIG. 2 schematically illustrates a state in that the power amplifier and the power supply unit in the high-efficiency amplifier shown in FIG. 1 are mounted on a substrate. On the input side of the power supply unit, input terminal 411 for controlling a power supply function is provided. On the input side of the amplifier, input terminal 412 of an amplified signal is provided. The power supply unit is connected to the amplifier through power supply output line 413 for an amplifier.

Generally, the amplifier and the power supply unit are configured as a separate circuit block, and further amplifying element (transistor) 45 that is used for the amplifier and switching element (switching transistor) 44 that is used for the power supply unit are contained individually in a separate package, because of dealing with comparatively large power. Therefore, an area for mounting two packages of the transistor in the substrate is necessary.

Here, as one example, in the configuration described with reference to FIG. 1, the case will be studied in which an amplifier having 90 W saturation power in the band of 2 GHz is configured, using the same transistor elements for transistor 45 and switching transistor 44 that constitute the power amplifier, respectively.

It is assumed that an element containing one field-effect transistor in one package, which is a product "MRF21090" from Freescale Semiconductor, Inc., is selected for a specific transistor having 90 W power. In this case, the outside dimensions of the transistor, except for the electrode portion, are about 34 mm×13.8 mm per unit as shown in FIG. 3. Therefore, the mounting area of a transistor portion requires twice the area defined by these dimensions at a minimum, i.e. a mounting area of about 9.4 cm$^2$.

As mentioned, in the case of the high-efficiency amplifier configured as described above, the mounting area of the transistors for two packages is necessary, because the transistors respectively contained in a separate package are used for the amplifying element and the switching element, which provides a disadvantage in terms of downsizing a device. Also, the configuration provides a disadvantage in terms of lowering the cost of a device.

SUMMARY OF THE INVENTION

An object of the present invention is to provide a high-frequency power amplifier requiring linearity and high efficiency, with miniaturization and lower cost realized.

A high-frequency power amplifier of the present invention comprises a power supply unit for including a transistor for switching whose drain electrode—source electrode or collector electrode—emitter electrode are on/off controlled according to a pulse signal corresponding to an envelope signal of a high-frequency signal applied to a gate electrode or to a base electrode, and for generating a voltage corresponding to the envelope signal by means of on/off operation of the transistor for switching; and a transistor for power amplification which is a source electrode grounded type or an emitter electrode grounded type, to which a voltage generated by the power supply unit is supplied as an operating voltage, in which the high-frequency signal is applied to the gate electrode or to the base electrode, wherein the transistor for switching in the power supply unit and the transistor for power amplification are configured in one package so that the source electrodes or the emitter electrodes are commonly connected.

According to the present invention, an amplifier can be configured such that its total size is smaller, because two transistors contained in one package used for parallel running are adopted as a transistor for power amplification and a transistor for switching that constitute a high-efficiency amplifier for which techniques such as ET or EER are used.

Further, according to the present invention, reduction in cost can be accomplished, because a transistor for power amplification and a transistor for switching that constitute a high-efficiency amplifier can be configured using two transistors contained in one package for parallel running, so that each the transistors does not have to be configured by a single transistor.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 4:
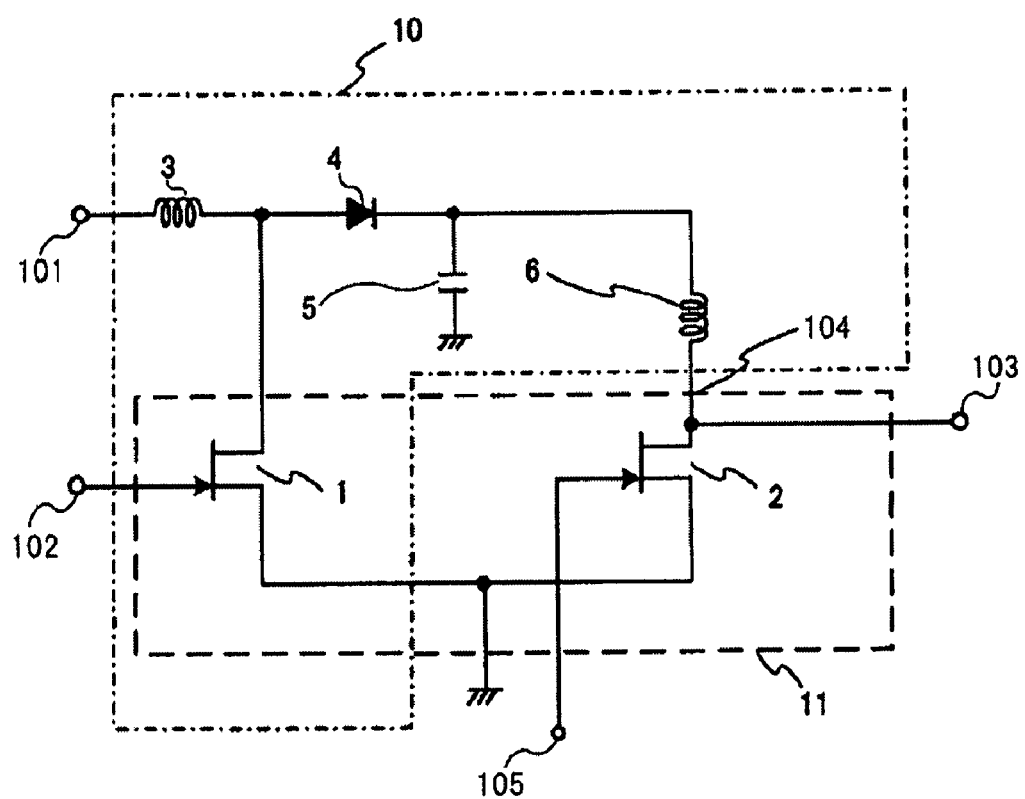
FIG. 4 is a circuit diagram illustrating one exemplary embodiment of a configuration of a high-frequency power amplifier of the present exemplary embodiment.

FIG. 4 is a circuit diagram illustrating one exemplary embodiment of a configuration of a high-frequency power amplifier of the present exemplary embodiment.

The high-frequency power amplifier of the present exemplary embodiment includes transistor 2 for high-frequency amplification and transistor 1 for switching. In the present exemplary embodiment, these transistors are field-effect transistors. Transistor 2 for high-frequency amplification and transistor 1 for switching are contained in one package 11, and each source electrode of each transistor is commonly connected to the ground.

Power supply unit 10 for supplying transistor 2 for high-frequency amplification with power, includes transistor 1 for switching, coil 3, diode 4, capacitor 5, and choke coil 6. Power supply unit 10 supplies a drain electrode of transistor 2 for high-frequency amplification with the power through a power supply output terminal for the amplifier. A power supply voltage supplied to this drain electrode of transistor 2 for high-frequency amplification is controlled by externally inputting a control signal to transistor 1 for switching in power supply unit 10.

The interconnection among each component will be described with reference to FIG. 4.

As shown in FIG. 4, one of two terminals of coil 3 is connected to power supply terminal 101 and the other terminal is connected to an anode electrode of diode 4. Transistor 1 for switching has its gate electrode connected to input terminal 102 for controlling a power supply function and its drain electrode is connected between coil 3 and diode 4. Power supply terminal 101 is supplied with a constant voltage (VDD).

A cathode electrode of diode 4 is connected to one of two terminals of choke coil 6. A junction portion between diode 4 and choke coil 6 is connected to the ground through capacitor 5.

A high-frequency signal is applied to a gate electrode of transistor 2 for high-frequency amplification through input terminal 105 of an amplified signal. The drain electrode of transistor 2 for high-frequency amplification is connected to the other one of the two terminals of choke coil 6 and also to output terminal 103 of an amplified signal.

Operation of the high-frequency power amplifier of the present exemplary embodiment will be described.

Figure 1:
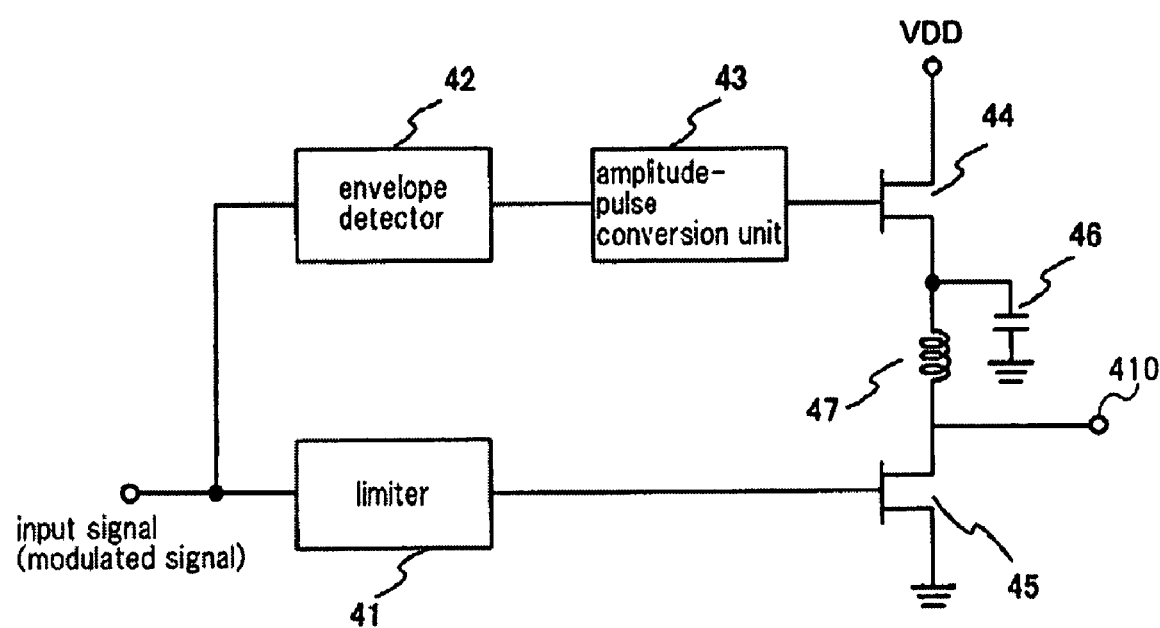
FIG. 1 is a schematic block diagram illustrating an example of a high-efficiency amplifier to which an EER technique is applied.
Figure 2:
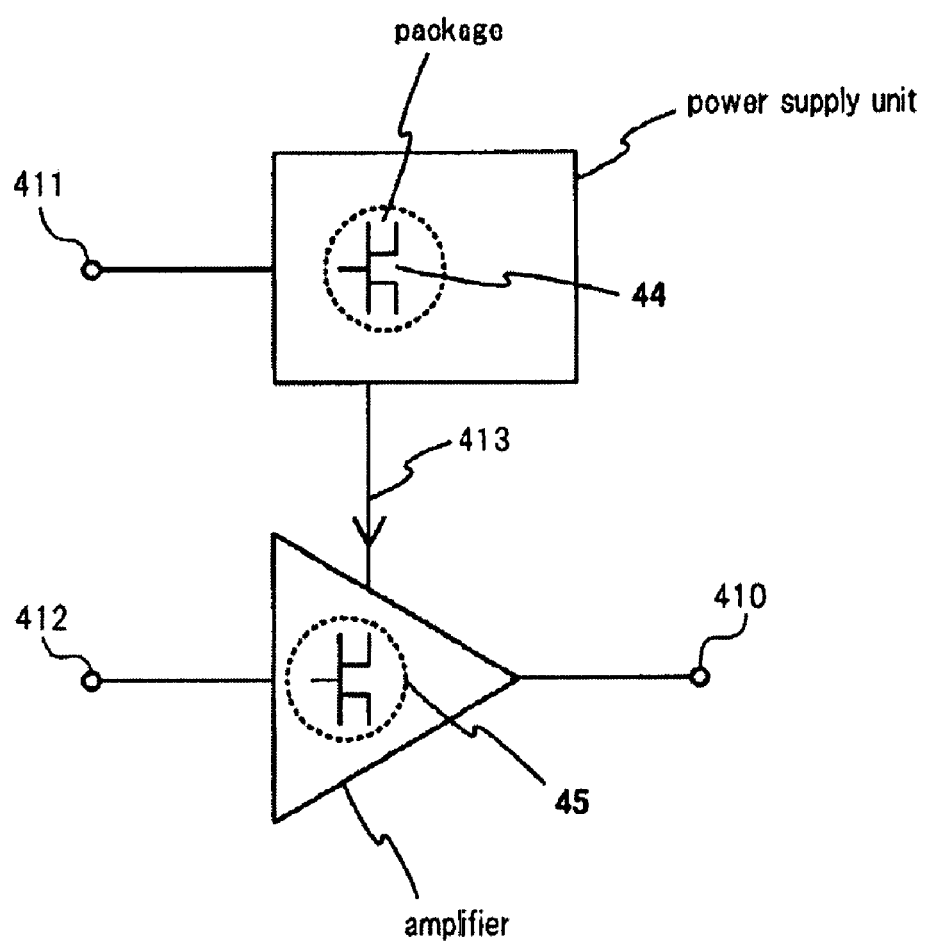
FIG. 2 is a view schematically illustrating a state in which an amplifier and a power supply unit are implemented on a substrate in the high-efficiency amplifier.

Transistor 2 for high-frequency amplification is a transistor corresponding to transistor 45 constituting the power amplifier in the high-efficiency amplifier shown in FIG. 1, and a phase modulated component signal of a high-frequency input signal is supplied, for example, to the gate electrode thereof. The drain electrode of transistor 2 is supplied with a power supply voltage by power supply unit 10 through choke coil 6, and a source electrode of transistor 2, along with a source electrode of transistor 1 for switching, is commonly connected to the ground in package 11.

Also, the configuration of power supply unit 10, including coil 3, transistor 1 for switching, diode 4 and capacitor 5, is a configuration of a switching regulator used for a normal DC/DC converter (see Japanese Patent Laid-Open No. 08-275514). When transistor 1 for switching is turned on, electric current I, $I=(VDD/L)\int dt$, flows in coil 3, storing electromagnetic energy in coil 3. The stored electromagnetic energy is transferred to capacitor 5 through diode 4 while transistor 1 for switching is off, and voltage at the terminal of capacitor 5 is increased up to the voltage corresponding to the stored electromagnetic energy in coil 3.

In the present exemplary embodiment, the gate electrode of transistor 1 for switching is supplied with a power supply function control signal formed of a pulse signal such as a PWM signal in which a pulse width is changed according to the level of an envelope signal of the high-frequency input signal, a pulse number modulation (PNM) signal in which the number of pulses per unit time (=density) is variably changed according to the envelope signal level of the high-frequency input signal, and the like.

This power supply function control signal reduces the energy stored in coil 3 by shortening the duration time for which transistor 1 for switching is turned on (by making the pulse width or the pulse density small), when the amplitude of the envelope signal is small, and thereby the power supply voltage for the amplifier is controlled to decrease. On the other hand, when the amplitude of the envelope signal is large, the energy stored in coil 3 is made high by prolonging the duration time for which transistor 1 for switching is turned on (by making the pulse width or the pulse density large), and thereby the power supply voltage for the amplifier is controlled to increase.

In such a manner, by controlling the ratio of ON/OFF of transistor 1 for switching, corresponding to the envelope signal level of the high-frequency signal input by means of this pulse signal, a voltage that changes corresponding to the envelope signal level of the high-frequency signal input is output to the power supply output line 104 for the amplifier of power supply unit 10. Accordingly, a signal applied to transistor 2 for high-frequency amplification is amplified so that its amplitude changes correspondingly to the power supply voltage, and the amplitude modulated component is also reproduced faithfully, whereby the high-frequency power amplifier having low distortion and high efficiency can be realized.

Figure 5:
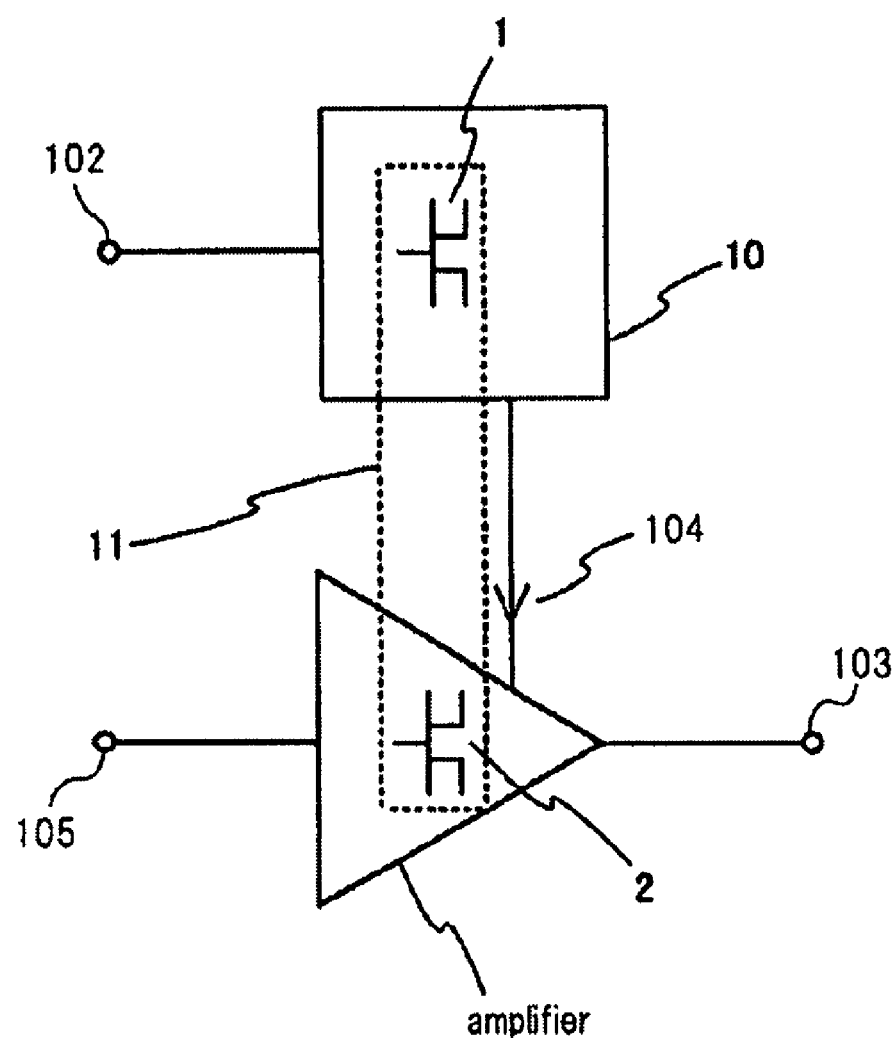
FIG. 5 is a view schematically illustrating a state in that a power amplifier and a power supply unit are mounted on a substrate in a high-efficiency amplifier of the present exemplary embodiment.

FIG. 5 is a view schematically illustrating a state in which the power amplifier and the power supply unit are mounted on a substrate in the high-efficiency amplifier of the present exemplary embodiment. As shown in FIG. 5, an amplifying element of transistor 2 for high-frequency amplification and a switching element of transistor 1 for switching are mounted on the substrate as one package 11 containing the amplifying element and switching element of transistors 2 and 1 respectively.

In the configuration of the amplifier as shown in FIG. 1, the amplifier and the transistor for controlling the power supply function of the amplifier are composed of separate transistors respectively contained in one (or more) package. On the contrary, in the present exemplary embodiment, using a transistor package containing two transistors in one package, one of the transistors is operated as a linear amplifier and the other of the transistors is operated in a switching mode, thereby the amplifier is configured. Therefore, the transistors in one package can constitute an amplifier equivalent to that of the related art, resulting in a smaller mounting area, so that there can be provided advantages in which miniaturization and a decrease in the cost of a device are accomplished.

The high-frequency power amplifier of the present exemplary embodiment means, for example, that, by using an element for push-pull amplification containing two field-effect transistors whose sources are commonly connected (to the ground) in one package, one of the field-effect transistors is used as transistor 1 for switching in power supply unit 10, and the other of the field-effect transistors is used as transistor 2 for high-frequency amplification. The implementation area in the substrate for transistor 1 for switching and in the substrate for transistor 2 for high-frequency amplification can be reduced, compared with the case where each of the transistors is implemented as a separate element.

Figure 6:
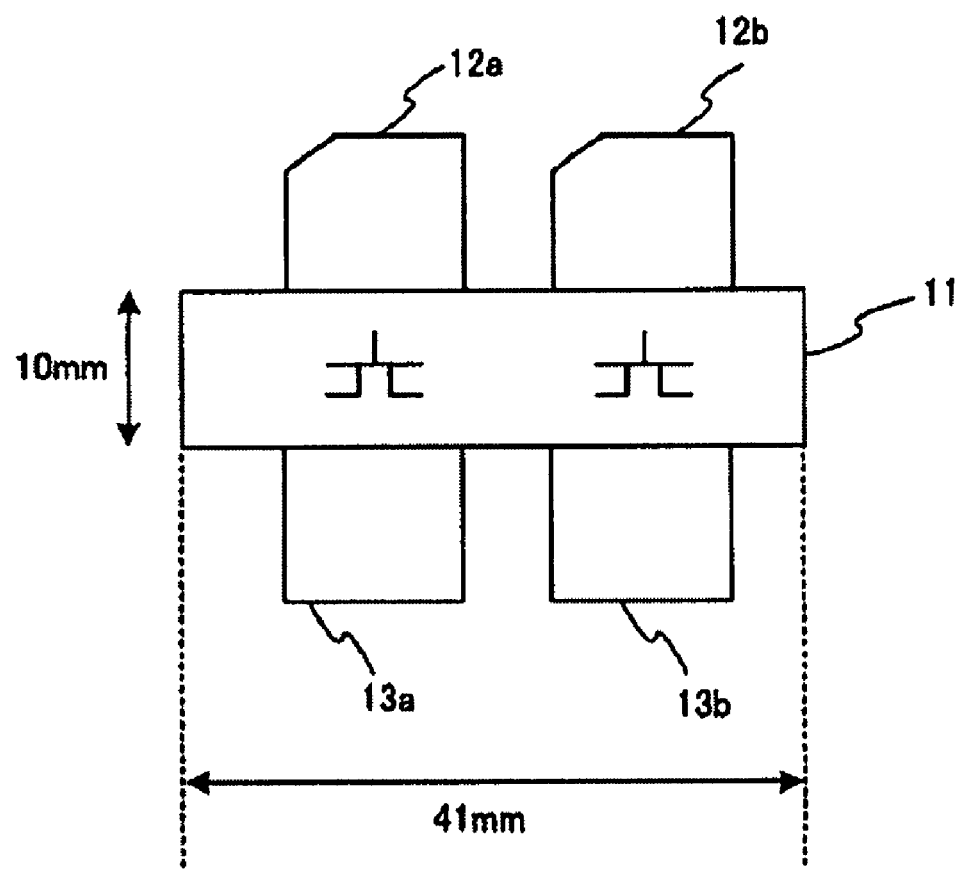
FIG. 6 is a view illustrating an exemplary embodiment of outline dimensions, when an element containing two field-effect transistors in one package, which are used to configure the amplifying element for the high-efficiency amplifier and the switching element for the power supply unit.

FIG. 6 is a view illustrating an exemplary embodiment of the outline dimensions of the present exemplary embodiment in which, by using the element containing two field-effect transistors in one package, the amplifying element used for the high-efficiency amplifier and the switching element used for the power supply unit are configured.

Figure 3:
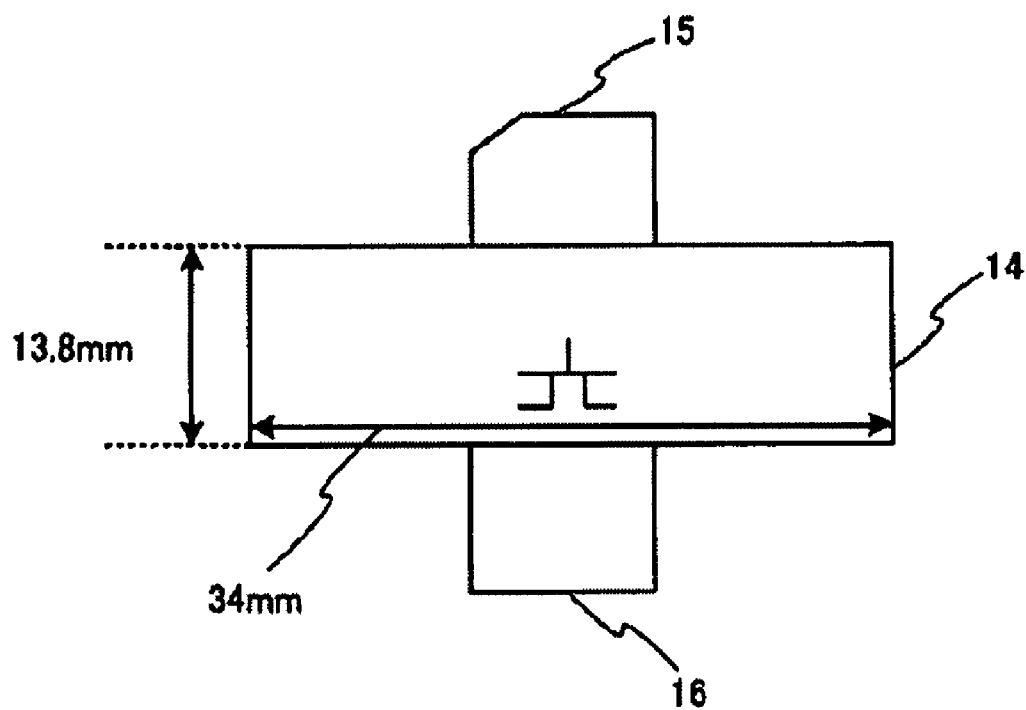
FIG. 3 is a view illustrating an example of outline dimensions of an element containing one field-effect transistor in one package, usable as an amplifying element for a high-efficiency amplifier and as a switching element for a power supply unit.

Here, as one example, similarly to the description with reference to FIG. 3, the configuration of an amplifier having 90 W saturation power in the band of 2 GHz will be studied. It is assumed that, to configure the amplifier having 90 W in one package according to the present exemplary embodiment, a product "MRF5P21180" from Freescale Semiconductor, Inc., which contains two transistors in one package, is applied as the element for push-pull amplification.

In this case, as shown in FIG. 6, the outline dimensions, except for the electrode portion of this transistor, are about 41 mm×10 mm, and the implementation area is about 4.1 $cm^2$. Therefore, an amplifier whose area that consists only of a transistor portion is made smaller by 43%, compared with the area of 9.4 $cm^2$ of the conventional configuration, can be configured, and the amplifier can be downsized so that the area even including the area for peripheral circuits etc. is decreased by up to about a half of that of the conventional configuration.

One example of an element for a push-pull amplifier or a balance amplifier, containing two field-effect transistors in one package whose source electrodes are commonly connected in the one package, which is used to configure power amplifiers of class A, AB, B etc. as a push-pull amplifier or a balance amplifier, is the product "MRF5P21180" described above.

The present exemplary embodiment focuses on the element for a push-pull amplifier or a balance amplifier, containing two field-effect transistors in one package whose source electrodes are commonly connected, and one of the transistors in the package is used as an amplifier and the other of the transistors is used as a switching element. Then, by configuring the high-efficiency amplifier to which ET or EER techniques etc. are applied, using the two transistors contained in one package, the goal is intend to achieve miniaturization and a decrease in cost of a power amplifier requiring linearity and high efficiency.

However, transistor 45 and switching transistor 44 in the high-efficiency amplifier shown in FIG. 1 are configured so that their sources are not commonly connected. Therefore, instead of the element containing two field-effect transistors in one package for a push-pull amplifier or a balance amplifier described above, transistor 45 and switching transistor 44 in the high-efficiency amplifier shown in FIG. 1 cannot be directly adapted.

Then, in the present exemplary embodiment, a power supply unit including a switching transistor whose source electrode is connected to the ground as a switching element is used as the power supply unit for supplying the transistor of the amplifying element with the operating voltage. Then, the source electrode of the transistor of the amplifying element and the source electrode of the transistor of the switching element in the power supply unit are commonly connected to the ground. In such a manner, one of the two field-effect transistors whose source electrodes are commonly connected in the package is operated as an amplifier, and the other of the transistors is operated as a switching element.

A high-frequency power amplifier includes an amplifier configured as a push-pull amplifier or a balance amplifier, in which two transistors used for linear amplifiers of class A, class AB and class B etc. are contained in one package. Such a high-frequency power amplifier outputs two amplified signals corresponding to two input signals respectively, by means of the two transistors contained in the package. In the present exemplary embodiment, of the two field-effect transistors configured as a push-pull amplifier or a balance amplifier, contained in one package, one transistor is operated as an amplifier and the other transistor is operated as a switch for the controlling power supply function of the amplifier to achieve high efficiency. In such a manner, by using the two transistors contained in one package, the high-efficiency amplifier to which ET or EER techniques etc. are applied is configured, and therefore the high-efficiency amplifier used for radio communication devices etc. can be provided having a smaller size and at a lower cost.

In addition, in the exemplary embodiment described above, the element containing two transistors in one package is used, but by further using an element containing three or more transistors in one package, each transistor can be also arranged so that amplifiers and switching elements are operated respectively by the desired number of transistors, though the basic configuration is as described above.

In addition, in the exemplary embodiment described above, transistors for a push-pull amplifier or a balance amplifier is used as parallel running transistors, but parallel running transistors are not to be considered limited to the transistors for these amplifiers, and an element which operates two transistors in phase may be used.

In addition, the transistor is not limited to a field-effect transistor, but also by using devices of various types, for example, a bipolar transistor, the configuration of the present exemplary embodiment can be made. In the case of using the bipolar transistor, the source electrode of the field-effect transistor turns into an emitter electrode of the bipolar transistor, the drain electrode turns into a collector electrode, and the gate electrode turns into a base electrode.

While a preferred embodiment of the present invention has been described using specific terms, such description is for illustrative purposes only, and it is to be understood that changes and variations may be made without departing from the spirit or scope of the following claims.

What is claimed is:

1. A high-frequency power amplifier comprising:
a power supply unit for including a transistor for switching whose drain electrode-source electrode or collector electrode-emitter electrode are on/off controlled according to a pulse signal corresponding to an envelope signal of a high-frequency signal applied to a gate electrode or to a base electrode, and for generating a voltage corresponding to said envelope signal by means of on/off operation of said transistor for switching, wherein the power supply unit comprises:
  a coil, a diode and a capacitor connected in series between a power supply terminal supplied with a constant voltage and a ground;
  said transistor for switching whose drain electrode or collector electrode are connected to a connection point of said coil and said diode, whose drain electrode-source electrode or collector electrode-emitter electrode are on/off controlled by applying said pulse signal corresponding to said envelope signal of said high-frequency signal to said gate electrode or to said base electrode; and
  a choke coil for supplying said drain electrode or said collector electrode of said transistor for power amplification with a voltage corresponding to said envelope signal, supplied from a connection point of said diode and said capacitor as said operating voltage; and
a transistor for power amplification which is a source electrode grounded type or an emitter electrode grounded type, to which a voltage generated by said power supply unit is supplied as an operating voltage, in which said high-frequency signal is applied to said gate electrode or to said base electrode, wherein
said transistor for switching in said power supply unit and said transistor for power amplification are configured in one package so that said source electrodes or said emitter electrodes are commonly connected.

2. A high-frequency power amplifier for use with a first signal that corresponds to a phase-modulated component of a high-frequency input signal, and a second signal comprising a pulse width modulated signal having a pulse width that corresponds to an envelope of the high-frequency input signal, the high-frequency power amplifier comprising:
a power supply unit including: (a) a switching transistor that has a first terminal coupled to a voltage supply terminal, a second terminal coupled to the second signal, and a third terminal, (b) a first coil coupled between the voltage supply terminal and the first terminal of the switching transistor, (c) a diode having an anode electrode coupled to the first terminal of the switching transistor, and a cathode electrode coupled to ground through a capacitor, and (d) a second coil coupled between the cathode electrode of the diode and the power supply output terminal, wherein the power supply unit provides an output voltage at a power supply output terminal; and
a power amplification transistor that has a first terminal coupled to the power supply output terminal, a second terminal coupled to the first signal, and a third terminal, wherein the switching transistor and the power amplification transistor are configured in one package so that the third terminals of the switching transistor and the power amplification transistor are commonly coupled to ground.

3. The high-frequency power amplifier of claim 2, wherein the first, second and third terminals of the switching transistor comprise drain, gate and source electrodes, respectively, of a field-effect transistor, and the first, second and third terminals of the power amplification comprise drain, gate and source electrodes, respectively, of a field-effect transistor.

4. The high-frequency power amplifier of claim 2, wherein the first, second and third terminals of the switching transistor comprise collector, base and emitter electrodes, respectively, of a bipolar junction transistor, and the first, second and third terminals of the power amplification comprise collector, base and emitter electrodes, respectively, of a bipolar junction transistor.

* * * * *